(12) United States Patent
Peng

(10) Patent No.: US 12,713,521 B2
(45) Date of Patent: Aug. 18, 2026

(54) CAMERA MODULE PACKAGING STRUCTURE AND ELECTRONIC DEVICE HAVING THE SAME

(71) Applicant: TRIPLE WIN TECHNOLOGY(SHENZHEN) CO.LTD., Shenzhen (CN)

(72) Inventor: Kuei-Feng Peng, New Taipei (TW)

(73) Assignee: TRIPLE WIN TECHNOLOGY(SHENZHEN) CO.LTD., Shenzhen (CN)

( * ) Notice: Subject to any disclaimer, the term of this patent is extended or adjusted under 35 U.S.C. 154(b) by 353 days.

(21) Appl. No.: 18/236,889

(22) Filed: Aug. 22, 2023

(65) Prior Publication Data

US 2024/0224419 A1 Jul. 4, 2024

(30) Foreign Application Priority Data

Jan. 4, 2023 (CN) ......................... 202310010294.5

(51) Int. Cl.

| | |
|---|---|
| ***H05K 1/18*** | (2026.01) |
| ***H05K 1/02*** | (2006.01) |
| ***H05K 1/14*** | (2006.01) |
| ***H05K 1/181*** | (2026.01) |
| ***H05K 3/12*** | (2006.01) |

(Continued)

(52) U.S. Cl.

CPC ............. *H05K 1/028* (2013.01); *H05K 1/147* (2013.01); *H05K 1/181* (2013.01); *H05K 3/1283* (2013.01); *H05K 3/323* (2013.01); *H05K 3/3489* (2013.01); *H05K 2201/0212* (2013.01); *H05K 2201/10083* (2013.01); *H05K 2201/10121* (2013.01)

(58) Field of Classification Search

CPC ........ H05K 1/028; H05K 1/147; H05K 1/181; H05K 1/185; H05K 1/118; H05K 1/189; H05K 2201/0212; H05K 2201/10083; H05K 2201/10121; H05K 2201/10734; H05K 3/323; H05K 3/1283; H05K 3/3489; H05K 3/305; H05K 3/361; H04N 23/54; H01L 23/4922; H01L 23/29; H10F 39/12

See application file for complete search history.

(56) References Cited

U.S. PATENT DOCUMENTS

2009/0152659 A1* 6/2009 Hiltunen ................ H05K 3/303 438/64
2011/0316162 A1* 12/2011 Ko ........................ H01L 21/563 438/121

(Continued)

FOREIGN PATENT DOCUMENTS

TW 201214584 A 4/2012

*Primary Examiner* — Roshn K Varghese
(74) *Attorney, Agent, or Firm* — ScienBiziP, P.C.

(57) ABSTRACT

A camera module packaging structure with simplified process, and an electronic device carrying it, includes a FPC, an ACF, an embedded printed circuit board, a no-flow underfill, and a chip-scale package camera module. The present application uses a no-flow underfill, which can omit steps of applying the flux and removing the flux, thus the process is simplified. By setting the ACF in the present application, a stable structure having vertical conduction characteristic and horizontal insulation characteristic is formed between the chip-scale packaged camera module and the flexible circuit board.

2 Claims, 3 Drawing Sheets

(51) Int. Cl.
*H05K 3/321* (2026.01)
*H05K 3/3489* (2026.01)

(56) References Cited

U.S. PATENT DOCUMENTS

| | | | | |
|---|---|---|---|---|
| 2013/0234317 | A1* | 9/2013 | Chen | H01L 25/50 438/108 |
| 2018/0007244 | A1* | 1/2018 | Wang | H04N 23/55 |
| 2018/0324955 | A1* | 11/2018 | Sood | H05K 1/181 |
| 2022/0407987 | A1* | 12/2022 | Han | H04N 23/55 |

* cited by examiner

CAMERA MODULE PACKAGING STRUCTURE AND ELECTRONIC DEVICE HAVING THE SAME

FIELD

The subject matter herein generally relates to a camera module packaging structure and an electronic device having the camera module packaging structure.

BACKGROUND

There are four packaging technologies for camera modules, namely Chip Scale Packaging (CSP), Chip on Board (COB), Chip on FPC (COF), and Flip Chip (FC). In the CSP process, Ball Grid Array (BGA) is generally formed on the circuit after extending the circuit on the back of the wafer. The size of the packaged chip is substantially equal to the size of a die, thus the CSP technology is widely used in portable electronic products such as mobile phones.

A chemical glue including epoxy resin, which is sometimes called underfill, is widely used in the BGA to improve the anti-drop performance of the camera module after the chip is soldered on the circuit board. However, the existing underfill process is too cumbersome and requires a lot of equipment.

Therefore, there is room for improvement in the art.

BRIEF DESCRIPTION OF THE DRAWINGS

Implementations of the present disclosure will now be described, by way of embodiments only, with reference to the attached figures.

DETAILED DESCRIPTION

Figure 1:
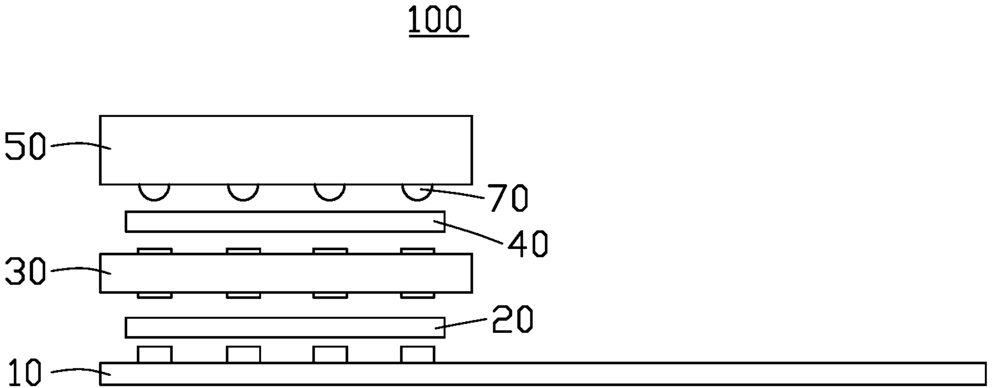
FIG. 1 is an exploded view of a camera module packaging structure according to an embodiment of the present disclosure.

Unless otherwise defined, all technical and scientific terms used herein have the same meaning as commonly understood by persons skill in the art. The terms used herein are only for the purpose of describing specific embodiments, and not intended to limit the embodiments of the present application.

It will be understood that when a layer is referred to as being "on" another layer, it can be directly on the other layer or intervening layers may be present therebetween. In contrast, when one layer is said to be "directly on" another layer, there are no intervening layers present.

The embodiments of the present application are described here with reference to sectional views, which are schematic diagrams of idealized embodiments (and intermediate structures) of the present application. Therefore, the difference in the shape of the drawing due to the manufacturing process and/or tolerance is predictable. Accordingly, the embodiments of the present application should not be interpreted as limited to the specific shape of the area illustrated here, but should include, for example, the deviation of the shape due to manufacturing. The areas shown in the drawings are only schematic, and their shape is not used to illustrate the actual shape of the device, and is not used to limit the scope of the present disclosure.

Some embodiments of the present application will be described in detail below with reference to the drawings. The following embodiments and features of the embodiments may be combined with each other in the absence of conflict.

Figure 2:
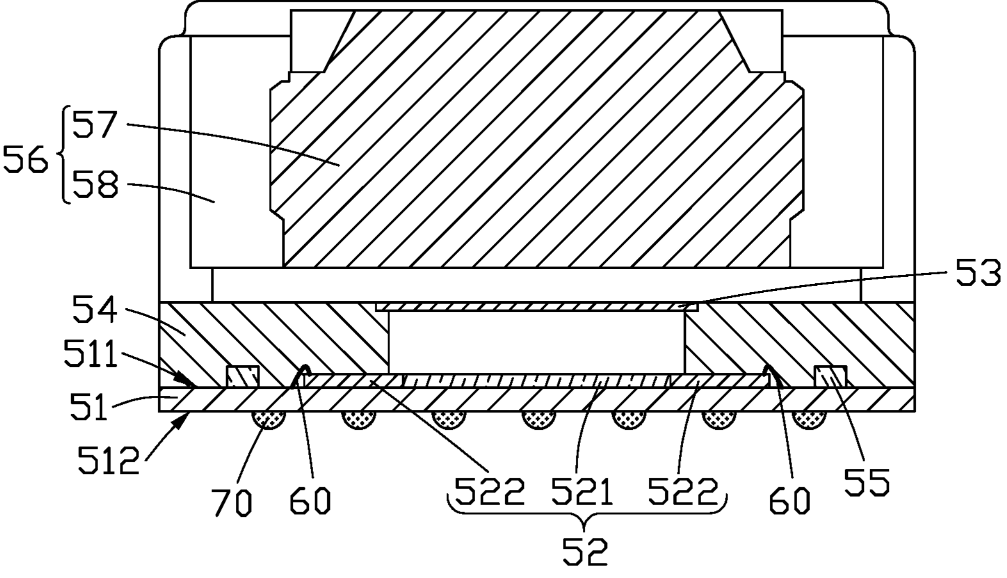
FIG. 2 is a cross-sectional view of a chip-scale package camera module of the camera module packaging structure of FIG. 1.

Referring to FIGS. 1 and 2, an embodiment of the present application provides a camera module packaging structure 100, which includes a flexible printed circuit 10, an anisotropic conductive film (ACF) 20, an embedded printed circuit board 30, no-flow underfill 40, and a chip-scale package camera module 50. The embedded printed circuit board 30 is electrically connected to the flexible printed circuit 10 through the anisotropic conductive film 20. The embedded printed circuit board 30 includes a printed circuit board and at least one passive component (such as a capacitor, a resistor, etc.) embedded inside the printed circuit board, so that the size of the embedded printed circuit board 30 and the size of the camera module packaging structure 100 can be reduced. The chip-scale package camera module 50 is arranged on a side of the embedded printed circuit board 30 away from the flexible printed circuit 10. The chip-scale package camera module 50 and the embedded printed circuit board 30 are connected to each other through the no-flow underfill 40. The chip-scale package camera module 50 is provided with a ball grid array (BGA) 70 on a surface facing the embedded printed circuit board 30, and the ball grid array 70 includes multiple solder balls.

Underfill uses capillary action to flow through the bottom of the BGA, thereby filling the bottom of the BGA. Then, the underfill is heated and solidified, and the solidified underfill infills a large area of the bottom of the BGA (generally covering more than 80%) to achieve the reinforcement purpose, thereby enhancing the connection stability between the chip-scale package camera module 50 and the embedded printed circuit board 30 and improving the anti-drop performance of the camera module packaging structure 100. The no-flow underfill 40 of the present application acts as a flux in the early stage, and is converted into an adhesive for bottom filling in the reflow furnace. The no-flow underfill 40 may be applied to the chip-scale package camera module 50 before the solder balls of the ball grid array 70 are attached to the chip-scale package camera module 50, and the reflow soldering step performed in the reflow furnace can simultaneously complete the bonding of the solder balls and the solidifying of the no-flow underfill 40. Since no additional flux is needed, the steps of applying the flux and removing the flux can be omitted, thereby simplifying the process. Moreover, the solidifying duration of the no-flow underfill 40 is short, which is beneficial to protect semiconductor components and improve the service life. In addition, the no-flow underfill 40 can be used in the reflow soldering step, and has a wider applicability.

The anisotropic conductive film 20 is composed of high-quality resin and conductive particles. ACF has an electrical conduction characteristic along vertical direction (Z-axis) and electrical insulation characteristic along horizontal direction (X, Y axis), and has excellent moisture-proof and adhesive functions. ACF can be applied to an object by a bonding machine (with a temperature of about 150~200° C.), but due to the existence of the reflow soldering process, the anisotropic conductive film 20 of the present application is an anisotropic conductive film that can withstand high temperature (above 250° C.), so as to withstand the temperature of the reflow furnace (peak value is about 250~260°

C.). By setting the anisotropic conductive film 20 in the present application, a stable structure having vertical conduction characteristic and horizontal insulation characteristic is formed between the chip-scale packaged camera module 50 and the flexible printed circuit 10, thereby avoiding a high-temperature lead tin soldering process that may cause damages to the flexible printed circuit 10.

In some embodiments, the no-flow underfill 40 includes a flux and an underfill. The flux may include an inorganic acid, and the inorganic acid may be, but not limited to, hydrochloric acid (HCl), hydrofluoric acid (HF), etc. The flux may also include an inorganic salt, and the inorganic salt may be, but not limited to, zinc chloride ($ZnCl_2$), ammonium chloride ($NH_4Cl$), etc. The underfill may be, but not limited to, epoxy resin.

As shown in FIG. 2, in some embodiments, the chip-scale package camera module 50 includes a substrate 51, a photosensitive chip 52, an infrared filter 53, and a packaging portion 54. The substrate 51 may be a printed circuit board (PCB), and the substrate 51 includes a first surface 511 and a second surface 512 opposite to the first surface 511.

The photosensitive chip 52 is arranged on the first surface 511 and approximately located in the middle of the first surface 511. The photosensitive chip 52 is used to acquire images, and may specifically be a Complementary Metal Oxide Semiconductor (CMOS) photosensitive chip.

As shown in FIG. 2, the photosensitive chip 52 may include a photosensitive area 521 and a non-photosensitive area 522. The photosensitive area 521 is substantially located in the middle of the photosensitive chip 52, and the rest area constitutes the non-photosensitive area 522. The photosensitive chip 52 may be electrically connected to the substrate 51 through metal wires 60. One end of the metal wire 60 may be soldered to a pad (not shown) of the non-photosensitive area 522, and the other end of the metal wire 60 may be soldered to the circuit of the substrate 51 to form an electrical connection. The metal wires 60 may be, but not limited to, gold wires, silver wires and the like.

As shown in FIG. 2, the packaging portion 54 is arranged on the first surface 511 and covers the photosensitive chip 52. It can be understood that the packaging portion 54 also covers the metal wires 60 to avoid damages or oxidization to the metal wires 60. The infrared filter 53 is arranged on the packaging portion 54 and opposite to the photosensitive chip 52. The infrared filter 53 may be arranged opposite to the photosensitive area 521 of the photosensitive chip 52.

In some embodiments, the infrared filter 53 is directly fixed on the packaging portion 54. That is, when the packaging portion 54 is formed by glue filling or injection molding, the infrared filter 53 is placed at a position corresponding to the photosensitive area 521 of the photosensitive chip 52, and the infrared filter 53 is adhered to the packaging portion 54 while the glue is curing. In some embodiments, the packaging portion 54 is cured by a curing glue, and the curing glue may be, but not limited to, ultraviolet curing glue or the like.

As shown in FIG. 2, in some embodiments, the chip-scale package camera module 50 further includes a passive component 55. The passive component 55 is located on the first surface 511 of the substrate 51, approximately at an end region of the substrate 51. The passive component 55 is covered and protected by the packaging portion 54. The passive component 55 may be, but not limited to, resistor, capacitor and so on.

As shown in FIG. 2, in some embodiments, the chip-scale package camera module 50 further includes a lens unit 56 arranged on the packaging portion 54. The lens unit 56 includes a lens 57 and a voice coil motor 58. The voice coil motor 58 has a cavity, and the lens 57 can be accommodated in the cavity. The lens unit 56 can be bonded to the surface of the packaging portion 54 away from the substrate 51 through the voice coil motor 58.

As shown in FIG. 2, in some embodiments, the ball grid array 70 is arranged on the second surface 512 of the substrate 51. Each solder ball of the ball grid array 70 may be used as an I/O terminal of the substrate 51 to be electrically connected to the embedded printed circuit board 30.

Figure 3:
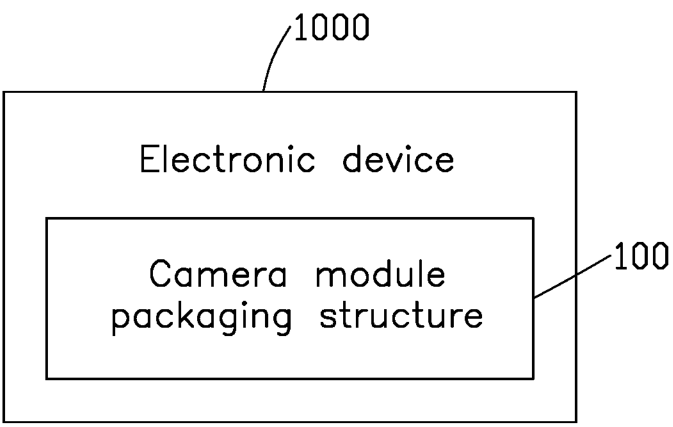
FIG. 3 is a diagrammatic view of an electronic device according to an embodiment of the present disclosure.

Referring to FIG. 3, an embodiment of the present application provides an electronic device 1000, which includes the camera module packaging structure 100 as described above. The electronic device 1000 may be, but not limited to, mobile phones or the like.

The no-flow underfill 40 of the present application acts as a flux in the early stage, and is converted into an adhesive for bottom filling in the reflow furnace. The reflow soldering step performed in the reflow furnace can simultaneously complete the bonding of the solder balls and the solidifying of the no-flow underfill 40. Since the steps of applying the flux and removing the flux can be omitted, the process is simplified. Moreover, the solidifying duration of the no-flow underfill 40 is short, which is beneficial to protect semiconductor components and improve the service life. In addition, the no-flow underfill 40 can be used in the reflow soldering step, and has a wider applicability. By setting the ACF in the present application, a stable structure having vertical conduction characteristic and horizontal insulation characteristic is formed between the chip-scale packaged camera module 50 and the flexible printed circuit 10.

The above descriptions are some specific embodiments of the present application, but the actual application process cannot be limited only to these embodiments. For those of ordinary skill in the art, other modifications and changes made according to the technical concept of the present application should all belong to the protection scope of the present application.

What is claimed is:

1. A camera module packaging structure comprising:

a flexible printed circuit;

an anisotropic conductive film;

an embedded printed circuit board electrically connected to the flexible printed circuit through the anisotropic conductive film;

a no-flow underfill comprising a flux and an underfill; and a chip-scale package camera module arranged on a side of the embedded printed circuit board away from the flexible printed circuit, wherein the chip-scale package camera module comprises a ball grid array on a surface facing the embedded printed circuit board, the chip-scale package camera module and the embedded printed circuit board are connected to each other through the no-flow underfill and the ball grid array, wherein the chip-scale package camera module comprises a substrate, a photosensitive chip, an infrared filter, and a packaging portion; the substrate comprises a first surface and a second surface opposite to the first surface, the photosensitive chip is arranged on the first surface, the packaging portion is arranged on the first surface and covers the photosensitive chip, and the infrared filter is arranged on the packaging portion and opposite to the photosensitive chip;

the second surface of the substrate is provided with the ball grid array.

2. An electronic device comprising:

a camera module packaging structure comprising:

a flexible printed circuit;

an anisotropic conductive film;

an embedded printed circuit board electrically connected to the flexible printed circuit through the anisotropic conductive film;

a no-flow underfill comprising a flux and an underfill; and a chip-scale package camera module arranged on a side of the embedded printed circuit board away from the flexible printed circuit, wherein the chip-scale package camera module comprises a ball grid array on a surface facing the embedded printed circuit board, the chip-scale package camera module and the embedded printed circuit board are connected to each other through the no-flow underfill and the ball grid array;

wherein the chip-scale package camera module comprises a substrate, a photosensitive chip, an infrared filter, and a packaging portion; the substrate comprises a first surface and a second surface opposite to the first surface, the photosensitive chip is arranged on the first surface, the packaging portion is arranged on the first surface and covers the photosensitive chip, and the infrared filter is arranged on the packaging portion and opposite to the photosensitive chip;

wherein the second surface of the substrate is provided with the ball grid array.

* * * * *